United States Patent [19]
Baker

[11] Patent Number: 4,520,319
[45] Date of Patent: May 28, 1985

[54] ELECTRONIC PHASE DETECTOR HAVING AN OUTPUT WHICH IS PROPORTIONAL TO THE PHASE DIFFERENCE BETWEEN TWO DATA SIGNALS

[75] Inventor: Donal E. Baker, American Township, Allen County, Ohio

[73] Assignee: Westinghouse Electric Corp., Pittsburgh, Pa.

[21] Appl. No.: 430,576

[22] Filed: Sep. 30, 1982

[51] Int. Cl.³ .............................................. H03L 7/10
[52] U.S. Cl. .................................... 328/133; 307/511; 307/514; 307/516; 307/519; 307/529; 328/55; 331/25; 375/120
[58] Field of Search ................... 307/272 R, 443, 511, 307/514, 516, 519, 529, 269; 328/55, 58, 109, 133, 139; 331/17, 25; 375/119, 120

[56] References Cited

U.S. PATENT DOCUMENTS

| | | | |
|---|---|---|---|
| 3,986,125 | 10/1976 | Eibner | 328/109 X |
| 4,020,422 | 4/1977 | Underhill | 307/511 X |
| 4,055,814 | 10/1977 | Abraham et al. | 307/511 X |
| 4,129,748 | 12/1978 | Saylor | 178/69.1 |
| 4,246,545 | 1/1981 | Reisfeld | 331/1 A |
| 4,316,150 | 2/1982 | Crosby | 307/511 X |
| 4,321,483 | 3/1982 | Dugan | 375/120 X |
| 4,445,094 | 4/1984 | Ryan | 375/120 X |

OTHER PUBLICATIONS

Markus, "Square to Sine with PLL", Modern Electronic Circuits Reference Manual McGraw-Hill Book Co., New York, 1980, p. 424.

Primary Examiner—Stanley D. Miller
Assistant Examiner—D. R. Hudspeth
Attorney, Agent, or Firm—R. P. Lenart

[57] ABSTRACT

A phase detecting circuit for use in a phase-locked loop is provided with a pair of bistable circuits such as type D flip-flops. One of the circuits is clocked by a controlled output signal from a voltage controlled oscillator, and reset by an input reference signal. The other of the bistable circuits is clocked by an inverted input reference signal and reset by an inverted output signal from the voltage controlled oscillator. The Q and NOT Q outputs of these bistable circuits are fed to a voltage divider and shifted in magnitude by a fixed amount such that the phase error detection signal is a constant zero when the input reference signal and output signals are in phase.

9 Claims, 4 Drawing Figures

ELECTRONIC PHASE DETECTOR HAVING AN OUTPUT WHICH IS PROPORTIONAL TO THE PHASE DIFFERENCE BETWEEN TWO DATA SIGNALS

BACKGROUND OF THE INVENTION

This invention relates to electronic phase detector circuits and more particularly to phase detector circuits suitable for use in phase-locked loops.

Phase-locked loop oscillators have many applications wherein a local oscillator must be synchronized to a received signal. Typically, a phase-locked loop includes a phase detecting device, a voltage controlled oscillator and a feedback circuit. The phase detecting device receives a reference data signal while simultaneously receiving a feedback data signal. In response thereto, the phase detecting device generates phase detection signals having an average amplitude indicating the difference in phase between the two data signals. The voltage controlled oscillator is coupled to receive the phase detection signal. In response thereto, the voltage controlled oscillator generates output signals having a frequency proportional to the magnitude of the phase detection signal. The output of the voltage controlled oscillator is used to form the feedback data signal through a feedback circuit.

Phase-locked loops are utilized, for example, to generate a control signal in synchronism with a reference signal. Synchronization between the control and reference signal is largely dependent upon the operational characteristics of the phase detector. This is because the phase detector controls the voltage controlled oscillator which changes its output frequency in response to the phase detection signal to correct errors indicated by the phase detection signal.

In the control circuitry of a solid state inverter or the like, it is often necessary to sense electrical waveforms in one circuit and then generate a control signal which accurately reflects a desired phase angle with respect to a reference signal. For example, in a variable speed constant frequency (VSCF) aircraft power system, it becomes necessary to force the output of a VSCF inverter into synchronism with an external power source. This permits momentary paralleling of the VSCF system with external power for non-interrupted power transfer. It is necessary to control the error between the VSCF output waveform and the external supply to small values. Any error will result in unbalanced real power flow. For lightly loaded conditions, this could mean that negative power would flow out of the VSCF inverter and positive power would flow out of the external supply during paralleled operation. If such a condition exists, even for as long as a tenth of a second, then the VSCF DC link voltage may rise to unacceptable levels. Therefore, an accurate and relatively fast phase-locked loop is required.

In VSCF systems, the output frequency is directly controlled by a voltage controlled oscillator. Further, any modulation of the voltage controlled oscillator input will cause frequency modulation of the VSCF output. In order to maintain good transient response, thereby minimizing DC link over-voltage transients, and to minimize frequency modulation of the VSCF output, it is necessary to have a relatively fast, low ripple phase detector in the phase-locked loop.

A common phase detector utilizes an exclusive OR gate to produce a phase detection error signal proportional to the difference in phase between a reference signal and a controlled signal. The exclusive OR phase detector produces a zero average output when the reference and controlled signal are at 90° relative to each other. This results in a phase lock 90° from the reference which can only be corrected by introducing an exactly 90° phase shift on one of the signals. This adds complexity and uncertainty to the circuit and its performance. In addition, an exclusive OR phase detector has stable operating points, at +90° and −90°, over a 360° control range. Therefore, the system can lock 180° out of phase from the desired location. Exclusive OR phase detectors also have a square wave output having a 50% duty cycle at phase-locked conditions. Therefore, a filter is needed between the phase detector and the voltage controlled oscillator to keep voltage controlled oscillator input voltage ripple and VSCF output frequency modulation to acceptable levels. Such a filter will hamper the transient response and stability of the phase-locked loop.

The present invention seeks to provide a phase detector circuit which has a single zero output point over the 360° control range, zero output at zero phase error on the inputs and zero ripple at the zero output or null condition.

SUMMARY OF THE INVENTION

An electronic phase detecting circuit constructed in accordance with the present invention comprises:

a first bistable circuit having a data input, a clock input, a reset input, and a NOT Q output, wherein the data input is connected to a logic high signal, and wherein the NOT Q output goes to a logic low state when a logic high signal is received at the lock input while the reset input is receiving a logic low signal, and the NOT Q output goes to a logic high state when a logic high signal is received at the reset input;

a second bistable circuit having a data input, a clock input, a reset input, and a Q output, wherein the data input is connected to a logic high signal and wherein the Q output goes to a logic high state when a logic high signal is received at the clock input while the reset input is receiving a logic low signal, and the Q output goes to a logic low state when a logic high signal is received at the reset input;

a first terminal for receiving a reference data signal;

a second terminal for receiving a controlled data signal;

means for connecting the first terminal to the first bistable circuit reset input;

means for connecting the second terminal to the first bistable circuit clock input;

a first inverting means connected between the first terminal and the second bistable circuit clock input; and a second inverting means connected between the second terminal and the second bistable circuit reset input.

A phase-locked loop circuit constructed in accordance with this invention includes the described phase detection circuit, and further comprises:

means for shifting the magnitude of the phase detecting circuit output voltage by a fixed amount;

means for integrating the shifted phase detecting circuit output voltage to obtain a frequency control signal; and means for generating the controlled data signal in response to the frequency signal.

DESCRIPTION OF THE PREFERRED EMBODIMENTS

Figure 1:
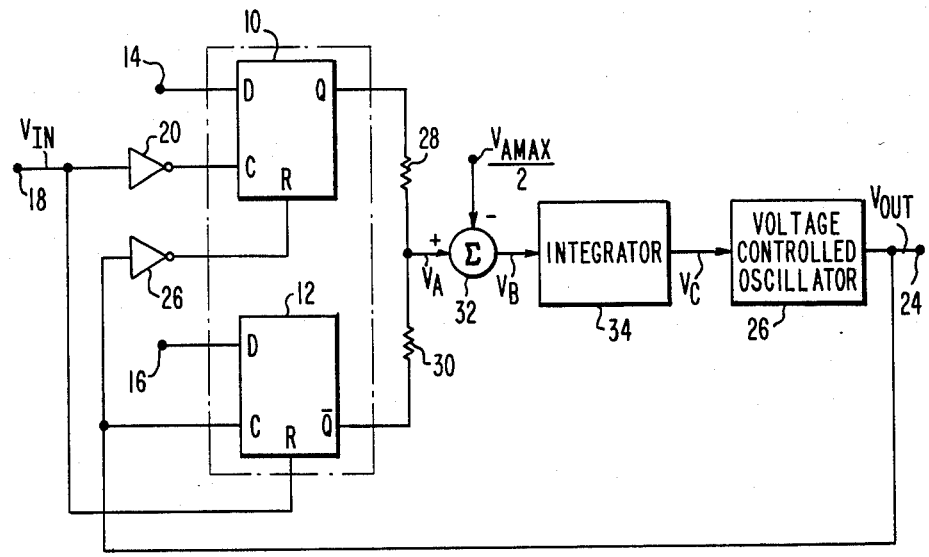
FIG. 1 is a schematic of a phase-locked loop circuit containing a phase detection circuit in accordance with one embodiment of the present invention.

Referring to the drawings, FIG. 1 is a schematic diagram of a phase-locked loop containing a phase detection circuit in accordance with one embodiment of the present invention. The phase detection circuit comprises a pair of bistable circuits, as represented by Type D flip-flops 10 and 12, wherein each bistable circuit has a data input D, a clock input C, and a reset input R. Flip-flop 10 has a Q output, while flip-flop 12 has a NOT Q output. The data inputs of flip-flops 10 and 12 are connected to a logic high signal by way of terminals 14 and 16, respectively. An input terminal 18 receives a reference data signal $V_{IN}$ and is connected to the reset of flip-flop 12 while being coupled by way of inverter 20 to the clock input of flip-flop 10. An output terminal 24 receives a controlled data output signal $V_{OUT}$ from voltage controlled oscillator 26, and is connected to the clock input of flip-flop 12, while being coupled to the reset input of flip-flop 10 by way of inverter 26. The outputs Q of flip-flop 10 and NOT Q of flip-flop 12 are connected to a voltage dividing means comprising the series connection of resistors 28 and 30. The voltage appearing at the midpoint of these resistors, $V_A$, has an average value which varies linearly from a first predetermined level to a second predetermined level as the phase difference between $V_{IN}$ and $V_{OUT}$ varies from $-180°$ to $+180°$. This voltage $V_A$ is transmitted to summation point 32 where it is shifted in magnitude by subtracting a fixed voltage equal to one half of the first predetermined voltage level, designated as $V_{AMAX}/2$. This results in a phase detection signal $V_B$ which is equal to zero when the output voltage signal $V_{OUT}$ and input reference signal $V_{IN}$ are in phase. The phase detection signal $V_B$ passes through integrator 34 where it is transformed into control voltage $V_C$ which controls the output frequency of voltage controlled oscillator 26.

Figure 2:
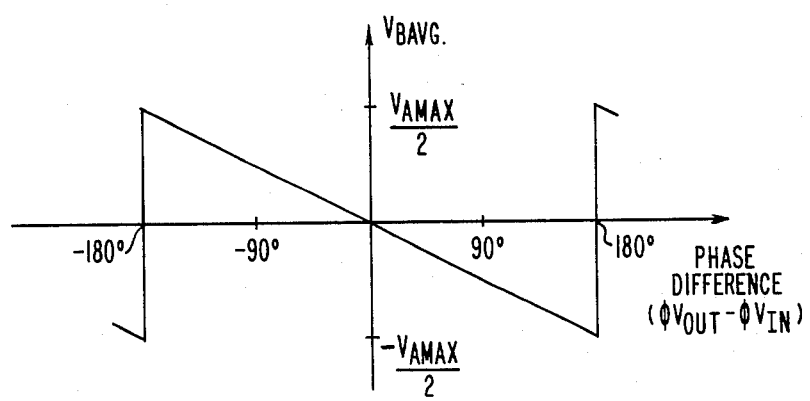
FIG. 2 is a plot of the average output voltage of the phase detection circuit of FIG. 1, which has been shifted in magnitude by a fixed amount.

FIG. 2 is a plot of the phase detection error signal $V_B$ with respect to the phase difference between input reference signal $V_{IN}$ and output voltage signal $V_{OUT}$. The average phase error detection signal $V_B$ varies linearly from a phase difference of $-180°$ to $+180°$, thereby having a single zero output stable condition over the 360° control range.

Figure 3:
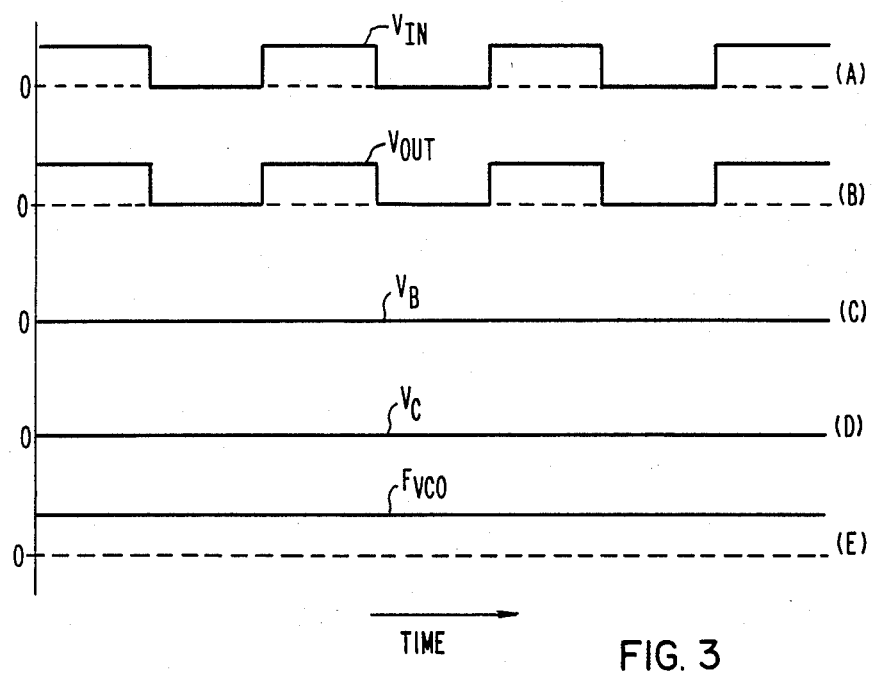
FIG. 3 is a series of waveforms illustrating voltage levels at various points in the circuit of FIG. 1 under phase-locked conditions.

FIG. 3 is a series of waveforms illustrating voltage levels at various points in the circuit of FIG. 1 under phase-locked conditions. Waveform A of FIG. 3 is the reference data signal $V_{IN}$ which is shown to be in phase with the controlled output data signal $V_{OUT}$ as seen in waveform B of FIG. 3. Under these conditions, both the phase detection error signal $V_B$ and the output voltage $V_C$ of integrator 34 remain constant at zero as shown in waveforms C and D of FIG. 3, respectively. Therefore, the output frequency $F_{VCO}$ of voltage controlled oscillator 26 remains constant as shown in waveform E of FIG. 3. Since the phase error detection signal $V_B$ remains constant at zero, there is little or no ripple component at phase lock. This minimizes filtering by the integrator, thereby improving transient response and minimizing circuit complexity. Because of the lack of ripple voltage, $V_C$ is also constant and the output frequency $F_{VCO}$ is not subject to modulation.

Figure 4:
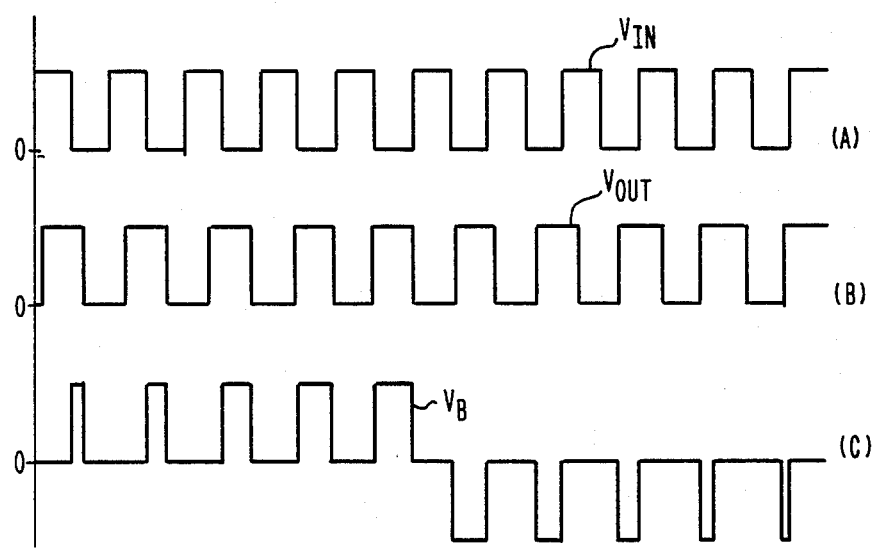
FIG. 4 is a series of waveforms illustrating voltages at various points in the circuit of FIG. 1, when the circuit is not phase-locked.

In order to further illustrate the operation of the circuit of FIG. 1, the waveforms of FIG. 4 illustrate voltage at various points in the circuit of FIG. 1 when the circuit is not in a phase-locked condition. In this illustration, the output voltage $V_{OUT}$ as shown in waveform B of FIG. 4, is not controlled with respect to the input reference data signal $V_{IN}$ of waveform A of FIG. 4. Waveform C of FIG. 4 illustrates the instantaneous phase detection error signal $V_B$. By analyzing the waveforms of FIG. 4, it is apparent that the phase detection error signal $V_B$ has an increasing pulse width, and therefore an increasing average absolute value as the phase difference between voltage $V_{IN}$ and $V_{OUT}$ approaches 180°.

While the present invention has been described in terms of what is believed to be the preferred embodiment, it should be apparent to those skilled in the art that various changes and modifications may be made in the preferred embodiment without departing from the scope of the invention. It is therefore intended that the appended claims cover all such changes and modifications which fall within the scope of the invention.

What is claimed is:

1. A phase detecting circuit comprising:
   a first bistable circuit having a data input, a clock input, a reset input and a NOT Q output, wherein said first circuit data input is connected to a logic high signal and wherein said NOT Q output goes to a logic low state when a logic high signal is received at said first circuit clock input and said first circuit reset input is receiving a logic low signal, and said NOT Q output goes to a logic high state when a logic high signal is received at said first circuit reset input;
   a second bistable circuit having a data input, a clock input, a reset input, and a Q output, wherein said second circuit data input is connected to a logic high signal and wherein said Q output goes to a logic high state when a logic high signal is received at said second circuit clock input and said second circuit reset input is receiving a logic low signal, and said Q output goes to a logic low state when a logic high signal is received at said second circuit reset input;
   a first terminal for receiving a reference data signal;
   a second terminal for receiving a second data signal;
   means for connecting said first terminal to said first circuit reset input;
   means for connecting said second terminal to said first circuit clock input;
   a first inverting means connected between said first terminal and said second circuit clock input; and
   a second inverting means connected between said second terminal and said second circuit reset input;
   wherein the average value of the sum of voltages appearing on said Q and NOT Q outputs is proportional to the phase difference between the reference signal and the second signal.

2. A phase detecting circuit as recited in claim 1, further comprising:
   a voltage dividing circuit branch connected between said Q and NOT Q outputs.

3. A phase detecting circuit as recited in claim 2, wherein said voltage dividing circuit branch comprises:
   a pair of resistors electrically connected in series, wherein the average voltage appearing at the junction of said resistors is proportional to the phase difference between said reference data signal and said controlled data signal.

4. A phase detecting circuit comprising:
   a first terminal for receiving a reference data input signal;
   a second terminal for receiving a second data signal;
   a first type D flip-flop circuit;
   a second type D flip-flop circuit;
   means for connecting a logic high signal to the D inputs of said first and second flip-flop circuits;
   a first inverting means coupled between said first terminal and the clock input of said first flip-flop circuit;
   means for connecting said first terminal to the reset input of said second flip-flop circuit;
   a second inverting means coupled between said second terminal and the reset input of said first flip-flop circuit;
   means for connecting said second terminal to the clock input of said second flip-flop circuit;
   means for coupling the Q output of said first flip-flop circuit to an output terminal; and
   means for coupling the $\overline{Q}$ output of said second flip-flop circuit to said output terminal;
   wherein the average value of the sum of voltages appearing on said Q and $\overline{Q}$ outputs is proportional to the phase difference between the reference signal and the second signal.

5. A phase detecting circuit as recited in claim 4, wherein said means for connecting the Q output of said first flip-flop circuit to said output terminal comprises a first resistor, and said means for connecting the $\overline{Q}$ output of said flip-flop circuit to said output terminal comprises a second resistor.

6. A phase detecting circuit as recited in claim 5, wherein said first and second resistors have equal resistance values.

7. A phase-locked loop circuit comprising:
   an input terminal for receiving a reference data signal;
   a second terminal for receiving a controlled data signal;
   a first bistable circuit having a data input, a clock input, a reset input and a NOT Q output, wherein said data input is connected to a logic high signal, said NOT Q output goes to a logic low state when a logic high clock pulse is received at said clock input and said reset input is receiving a logic low signal, and said NOT Q output goes to a logic high state when a logic high signal is received at said reset input;
   means for transmitting said reference data signal to the clock input of said first bistable circuit;
   means for transmitting said controlled data signal to the reset input of said first bistable circuit;
   a second bistable circuit having a data input, a clock input, a reset input and a Q output, wherein said data input is connected to a logic high signal, and Q output goes to a logic high state when a logic high clock pulse is received at said clock input and said reset input is receiving a logic low signal, and said Q output goes to a logic low state when a logic high signal is received at said reset input;
   means for inverting said reference data signal;
   means for transmitting the inverted reference data signal to the clock input of said second bistable circuit;
   means for inverting said controlled data signal;
   means for transmitting the inverted controlled data signal to the reset input of said second bistable circuit;
   a voltage divider circuit branch connected between said Q output of said second bistable circuit and said NOT Q output of said first bistable circuit, wherein the average voltage on an intermediate point on said voltage divider circuit branch varies linearly from a first predetermined voltage level to a second predetermined voltage level as the phase difference between said reference signal and said controlled data signal varies from $-180°$ to $+180°$;
   means for shifting the magnitude of said average voltage by a fixed amount;
   means for integrating the shifted magnitude average voltage to obtain a frequency control signal;
   means for generating said controlled data signal in response to said frequency control signal; and
   means for coupling said controlled data signal to said second terminal.

8. A phase-locked circuit as recited in claim 7, wherein said voltage divider circuit branch comprises:
   a pair of resistors electrically connected in series, wherein said intermediate point is the common connection of said resistors.

9. A phase-locked loop circuit as recited in claim 7, wherein said means for shifting the magnitude of said average voltage comprises:
   a summing means which adds a fixed voltage to said average voltage.

* * * * *